(12) United States Patent
Wagoner et al.

(10) Patent No.: US 6,713,898 B2
(45) Date of Patent: Mar. 30, 2004

(54) INTERNAL REACTOR THYRISTOR STACK

(75) Inventors: Robert Gregory Wagoner, Roanoke, VA (US); Brian Mathew Hamill, Roanoke, VA (US); John Wilbur Cannon, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 183 days.

(21) Appl. No.: 09/683,252

(22) Filed: Dec. 5, 2001

(65) Prior Publication Data

US 2003/0103312 A1 Jun. 5, 2003

(51) Int. Cl.⁷ .............................................. H02M 7/00
(52) U.S. Cl. ......................................... 307/151; 363/71
(58) Field of Search ........................... 307/151; 363/71; 361/790, 775, 735.624

(56) References Cited

U.S. PATENT DOCUMENTS

| | | | |
|---|---|---|---|
| 3,913,003 A | * 10/1975 | Felkel | ........................ 257/665 |
| 4,427,934 A | 1/1984 | Tupper | |
| 4,475,150 A | 10/1984 | D'Atre et al. | |
| 4,492,975 A | * 1/1985 | Yamada et al. | .............. 257/726 |
| 4,570,212 A | 2/1986 | Edwards et al. | |
| 4,602,199 A | 7/1986 | Walker | |
| 4,746,850 A | * 5/1988 | Abbondanti | ................. 318/723 |
| 4,847,747 A | 7/1989 | Abbondanti | |
| 4,849,870 A | * 7/1989 | Heinrich | ....................... 363/37 |
| 4,870,338 A | 9/1989 | Abbondanti | |
| 5,043,797 A | * 8/1991 | Lopes | ......................... 257/714 |
| 5,483,140 A | 1/1996 | Hess et al. | |
| 5,712,587 A | 1/1998 | Schauder et al. | |
| 5,949,664 A | 9/1999 | Bernet et al. | |
| 6,542,390 B2 | * 4/2003 | Bixel | ........................... 363/71 |

* cited by examiner

*Primary Examiner*—Gregory J. Toatley, Jr.
*Assistant Examiner*—Sharon A. Polk
(74) *Attorney, Agent, or Firm*—Karl Vick; Kevin Duncan; Hunton & Williams LLP

(57) ABSTRACT

A configuration of a thyristor stack is provided. The stack includes thyristors, electrically conductive bars, and reactors that are mounted around the electrically conductive. Heat sinks may be included in the thyristor stack to assist in heat dissipation, although they may not be necessary. A method for constructing a thyristor stack is also provided.

18 Claims, 5 Drawing Sheets

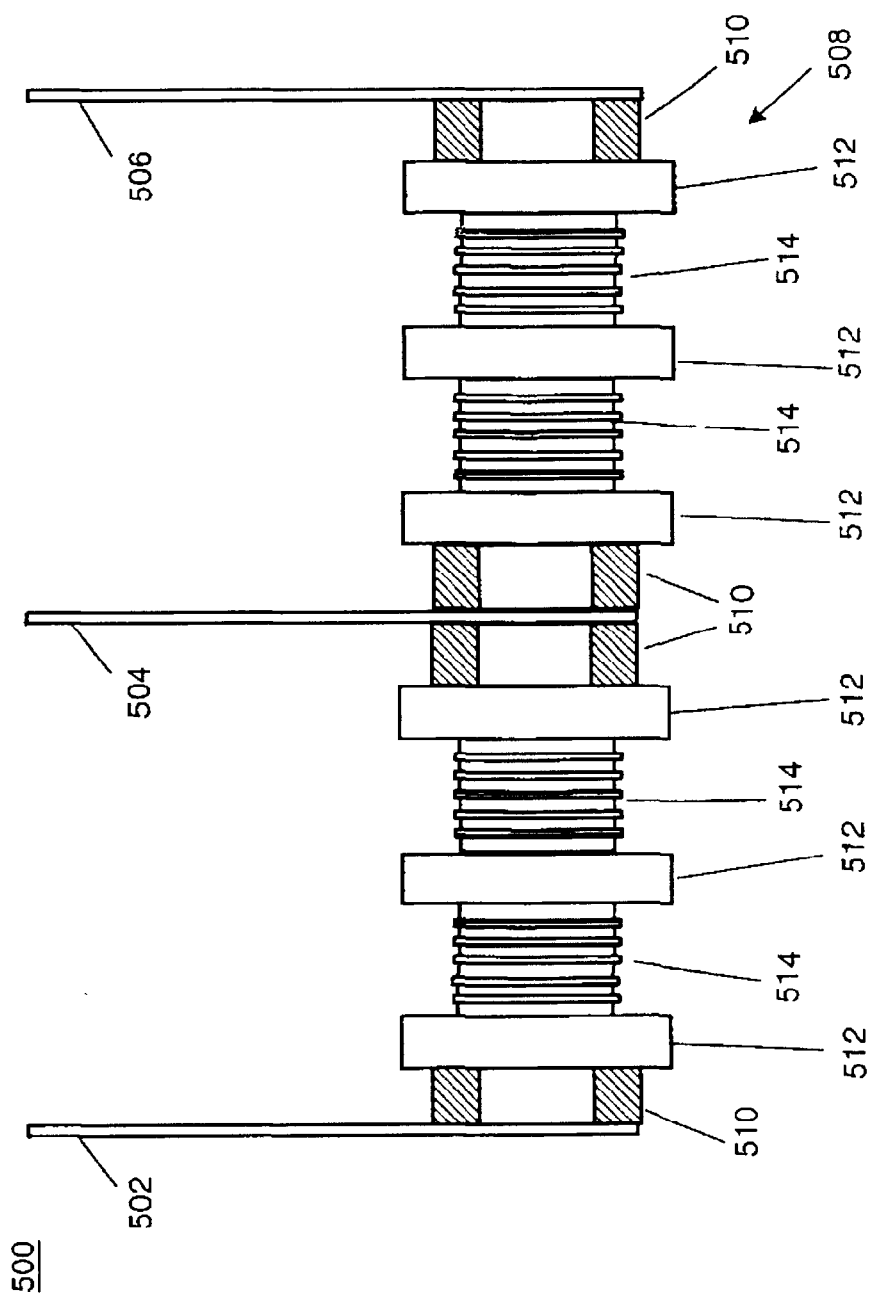

INTERNAL REACTOR THYRISTOR STACK

BACKGROUND

Thyristors are solid-state devices that provide flexible, reliable, and very fast control over voltages and currents. The main benefit of thyristors is that their conductivity may be controlled externally. Silicon Controlled Rectifiers (SCRs) are silicon-based thyristor units that are controlled by applying a triggering impulse to their gate terminal. SCRs act as open circuits until a triggering impulse is applied to the gate, at which time they begin to act similar to short circuits. Several SCRs (often six) may be arranged into a power bridge to provide controllable power conversion. The SCRs in a power bridge may be operated by sophisticated electronic systems that can be tailored to accommodate a great variety of electrical system hardware or power output requirements. Modern power generation systems rely heavily on SCR-based power bridges to provide a reliable and consistent supply of electricity to consumers.

SCRs can be cylindrically puck shaped, and SCR power bridges can be arranged in a modular stack system, which may be added to an existing power generation unit. Stack systems are typically more compact than other SCR power bridges. They also provide a safety benefit in that the stack may be encased in a housing that prevents accidental contact with the electrical devices, and may be provided with lockout equipment that helps ensure that the power is off when the cabinet is opened.

Ferrite cores can be placed in series with the main conducting paths of the SCR stacks to control the stresses placed on the SCRs. They effectively constitute a single turn inductor and may, among other things, help protect against an excessive rate of rise of the voltage (dv/dt) or an excessive rate of rise of the current (di/dt) that is applied to an SCR. While the SCRs can be clamped in the stack to heat sinks and insulators with a high mounting pressure, the ferrite cores are ordinarily mounted physically outside of the SCR stack. For example, FIG. 1 shows a configuration of a SCR stack diametric cell 102. The SCR stack diametric cell 102 is clamped between two bus bars 112 and 114 that may constitute two direct current outputs of a power conversion device. There may be two additional bus bars 116 and 118 that may constitute an alternating current input of a power conversion device. These two bus bars may be connected through an electrical connection 124 that comprises bends and increased mechanical complexity. An insulator 140 can be provided in the SCR stack 102 to provide an isolation mechanism for the bus bars, among other considerations. Attached to each of the bus bars, and external to the SCR stack, are the four ferrite cores 104, 106, 108, and 110 that may be used to protect the SCRs. In related art they comprise two U-shaped magnetically permeable structures, separated by NOMAX or another aramid material. In some applications, there may be no aramid material used between the two halves of the core, depending upon the required characteristics of the inductor. Also, in some applications, the ferrite material may be molded in one continuous piece with a hole in the center, instead of two halves. They may be placed around a bus bar, or other main SCR stack input/output means, that is made of copper or another electrically conductive material. The SCRs 120 may be separated by heat sinks 122 that dissipate heat into the ambient air. Stack-mounted SCRs have many important characteristics such as being easily removed, repaired, replaced, or otherwise serviced, and the external inductors allow for valuable protection of the SCRs, but they have their drawbacks. Among other limitations, externally mounted ferrite core SCR stacks may have a high production cost, low reliability, and may be mechanically difficult to assemble. Additional components, such as the insulator 140, bus bar 116 and electrical connection 124 are also needed.

SUMMARY OF THE INVENTION

The present invention overcomes the problems discussed above, and provides additional advantages, by employing a thyristor stack system with internally mounted reactors. It comprises two legs that are operatively connected between a first and a second bus bar, and the second bus bar and a third bus bar, respectively. Each of the legs further comprises a first thyristor operatively connected between a first and a second electrically conductive bar, each of the first the second electrically conductive bars being encircled by a first and a second magnetically permeable structure, respectively. The magnetically permeable structures may be ferrite toroids, and the thyristors may be silicon controlled rectifiers. Heat sinks may also be operatively connected between the thyristors and the electrically conductive bars. The system may also be employed in a load commutated inverter static starter power conversion unit.

BRIEF DESCRIPTION OF THE DRAWINGS

The present invention can be understood more completely from the following Detailed Description of exemplary embodiments and the accompanying drawings, in which:

FIG. 5 is an embodiment of the invention showing multiple SCRs and reactors.

DETAILED DESCRIPTION

Figure 1:
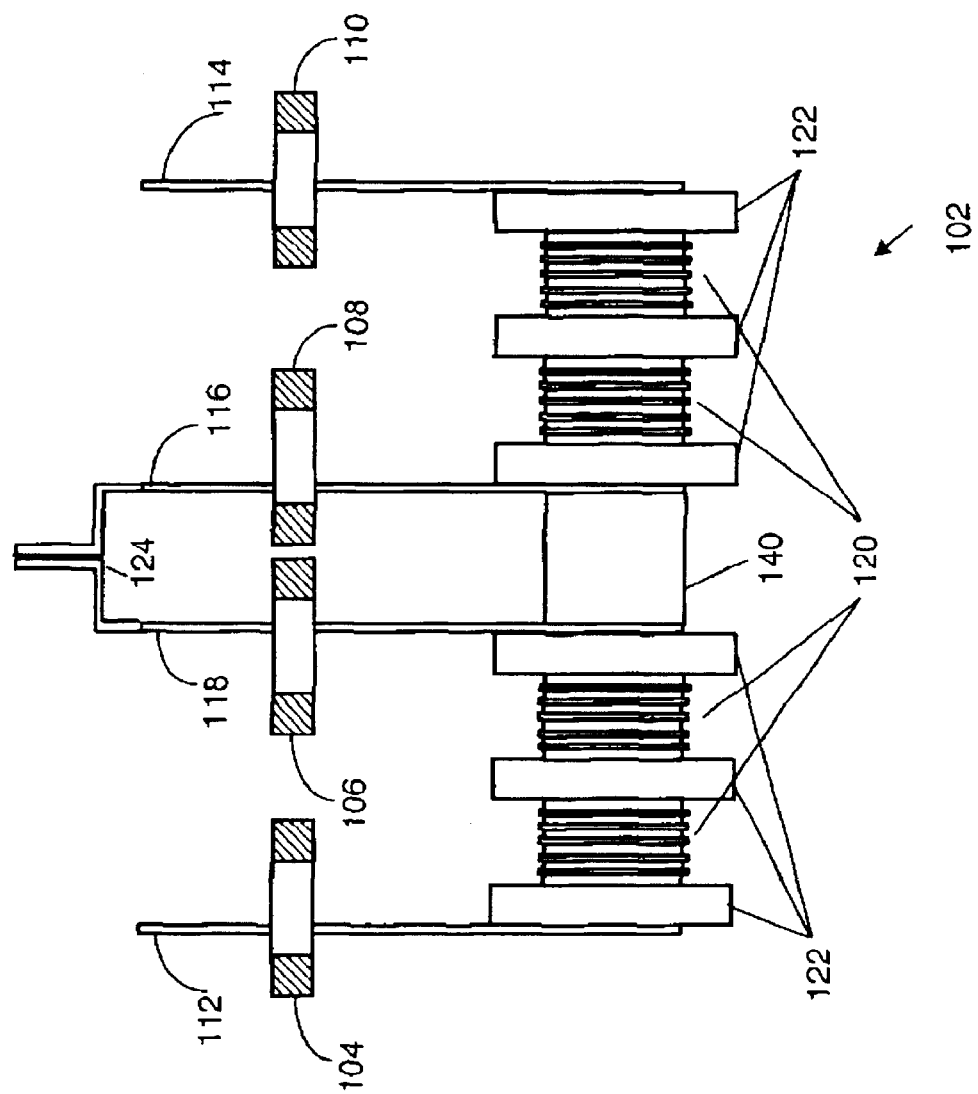
FIG. 1 is a SCR stack diametric cell.

An embodiment of the invention described herein is used in conjunction with a LCI static starter system. Although this embodiment is described, it will be understood to one skilled in the art that it may apply anywhere that thyristor stacks are employed.

LCIs are used in conjunction with starting and controlling the speed of electric generators. Due to the inability of a standard power conversion unit to produce an output that is controlled both for its magnitude, frequency, and phase angle, a modified power conversion system is needed. LCIs have been developed that produce an output in which all three of these characteristics may be modified.

In order to accomplish this degree of controllability, LCI systems rely heavily on thyristors. These devices have the unique characteristic that their conductivity may be controlled externally. They are more generally referred to as three terminal devices because they comprise an anode, a cathode, and a gate terminal. In order for the thyristor to conduct forward current the anode must have a positive voltage in relation to the cathode (more commonly know as forward biasing the thyristor) and a sufficient pulse must be applied to the gate terminal for the SCR to be turned on. If the thyristor were forward biased and no pulse were added to the gate terminal, it would continue to block the flow of current. If the device were reverse biased, however, it would inhibit current flow in the reverse direction.

In order to turn off the standard thyristor, the forward current must cease. This may be accomplished by adding a short circuit across the thyristor that will draw the current away, opening the circuit driving the thyristor, or driving a current in the opposite direction (more commonly referred to as reverse commutating the thyristor). These characteristics are specifically what allow the thyristor to be used in LCIs, but they do have their drawbacks.

As with any electrical circuit element, thyristors have certain bounds within which they operate properly. For example, thyristors in their non-conductive state typically only allow a minimal leakage current to pass. If an excessive voltage is applied to the anode in relation to the cathode (i.e., an over voltage event) the device may breakdown and allow current to flow freely as though it were a short circuit. If the current running through a thyristor is allowed to change too rapidly (i.e., a large di/dt), the thyristor may break down and once again behave like a short circuit. In addition, if the voltage applied to a thyristor is allowed to change too rapidly (i.e., a large dv/dt), the thyristor may also breakdown.

The operating limitations of a thyristor may be determined through testing. In addition, the operating limitations may vary between manufacturers and models, and a particular model may have some variations in operating limits. For example, a standard SCR was tested. For an ABB 6500V SCR it was determined that the maximum over voltage value, $V_{max}$ was 6500V. The maximum rate of change of the current was $di/dt_{max} < 400$ A/μs, and the maximum rate of change in the voltage was $dv/dt_{max} < 2000$ V/μs. Various SCRs are known in the art, and the present invention is not intended to be limited to the exemplary SCRs described herein.

Circuit elements may be used in conjunction with thyristors to protect them from excessive overvoltages, and rapid increases in applied voltages or currents when they are part of a larger configuration. For example, reactors may be placed in series with the thyristors in an attempt to impede the rate of rise of current. The reactors may also work in conjunction with other circuit elements, such as resistors and capacitors, to constrain the level and the rate of rise of the applied voltage. The reactors play a vital role in protecting the thyristors, but they have drawbacks when the physical design of the LCI is considered.

Figure 2:
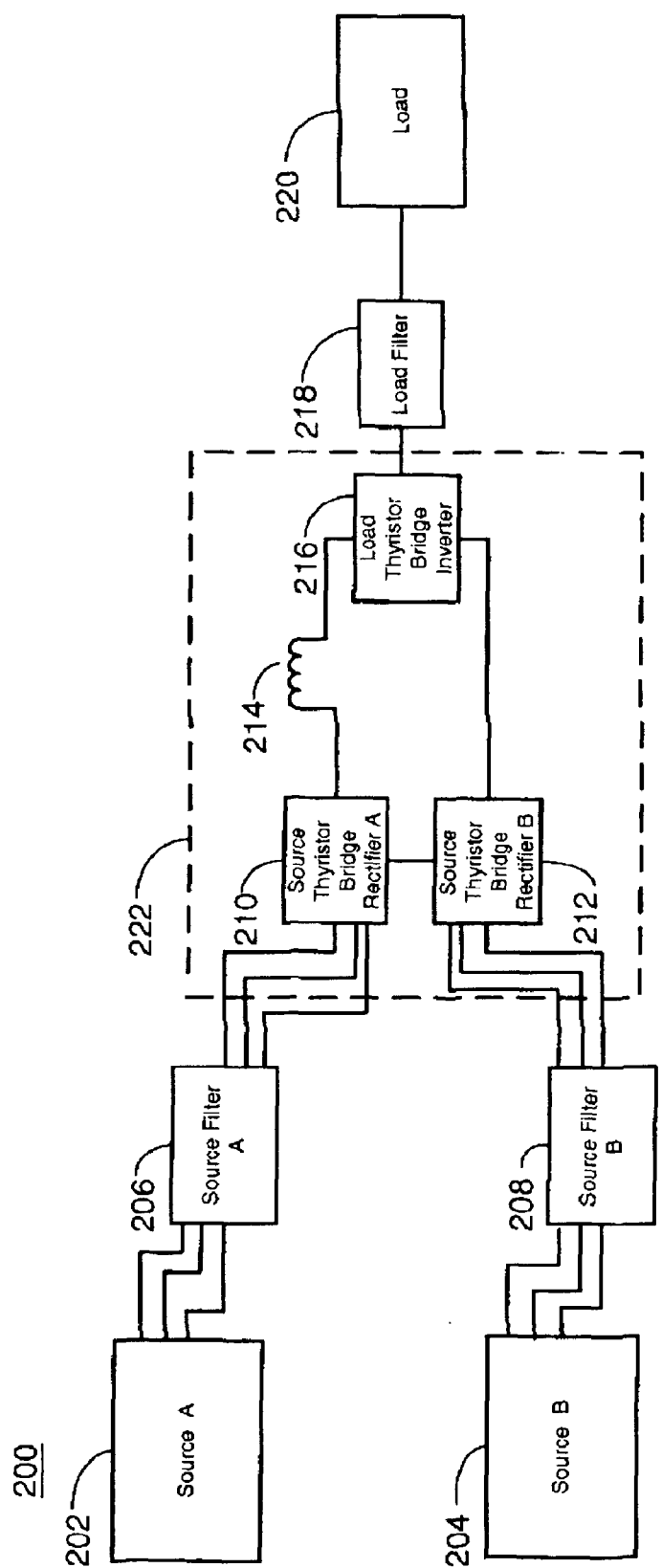
FIG. 2 is a block diagram of a Load Commutated Inverter (LCI) static starter.

An embodiment of the invention may be used with the LCI static starter 200 of an electric generator shown in FIG. 2. The LCI static starter 200 may have two standard three phase sources 202 and 204, two source filters 206 and 208, two source thyristor bridge rectifiers 210 and 212, a direct current bus inductor 214, a load thyristor bridge inverter 216, a load filter 218, and a load 220. This configuration may be used to start an electric generator by supplying a selectively controlled electrical signal to create a corresponding magnetic force in the field of the generator. The two input sources 202 and 204 may be, for example, standard three phase 2080 VAC sources operating at 60 Hz. The three phase sources may be electrically coupled to ground through two source filters 206 and 208 to further damp harmonics and deliver a cleaner signal to a power conversion circuit 222. In an embodiment of the invention, the source filters may each be a Y-connected filter wherein each leg comprises a resister and capacitor electrically coupled in series with one another. Various input sources and source filters are known in the art, and the present invention is not intended to be limited to the exemplary sources and filters described herein.

The outputs of the two source filters 206 and 208 may be electrically coupled to the input of the power conversion circuit 222. The power conversion circuit 222 may convert a standard alternating current input to a selectively controlled alternating current output, the frequency, magnitude, and phase angles being selectively controlled to meet the system requirements. The power conversion circuit 222 may, for example, have two source thyristor bridge rectifiers 210 and 212, electrically coupled to a load thyristor bridge inverter 216 through a direct current bus inductor 214. The source thyristor bridge rectifiers 210 and 212 are used to convert an alternating current input to a variable direct current output. The load thyristor bridge inverter 216 then converts the variable direct current output back into an alternating current output whose frequency, magnitude, and phase angle may be varied.

Figure 3:
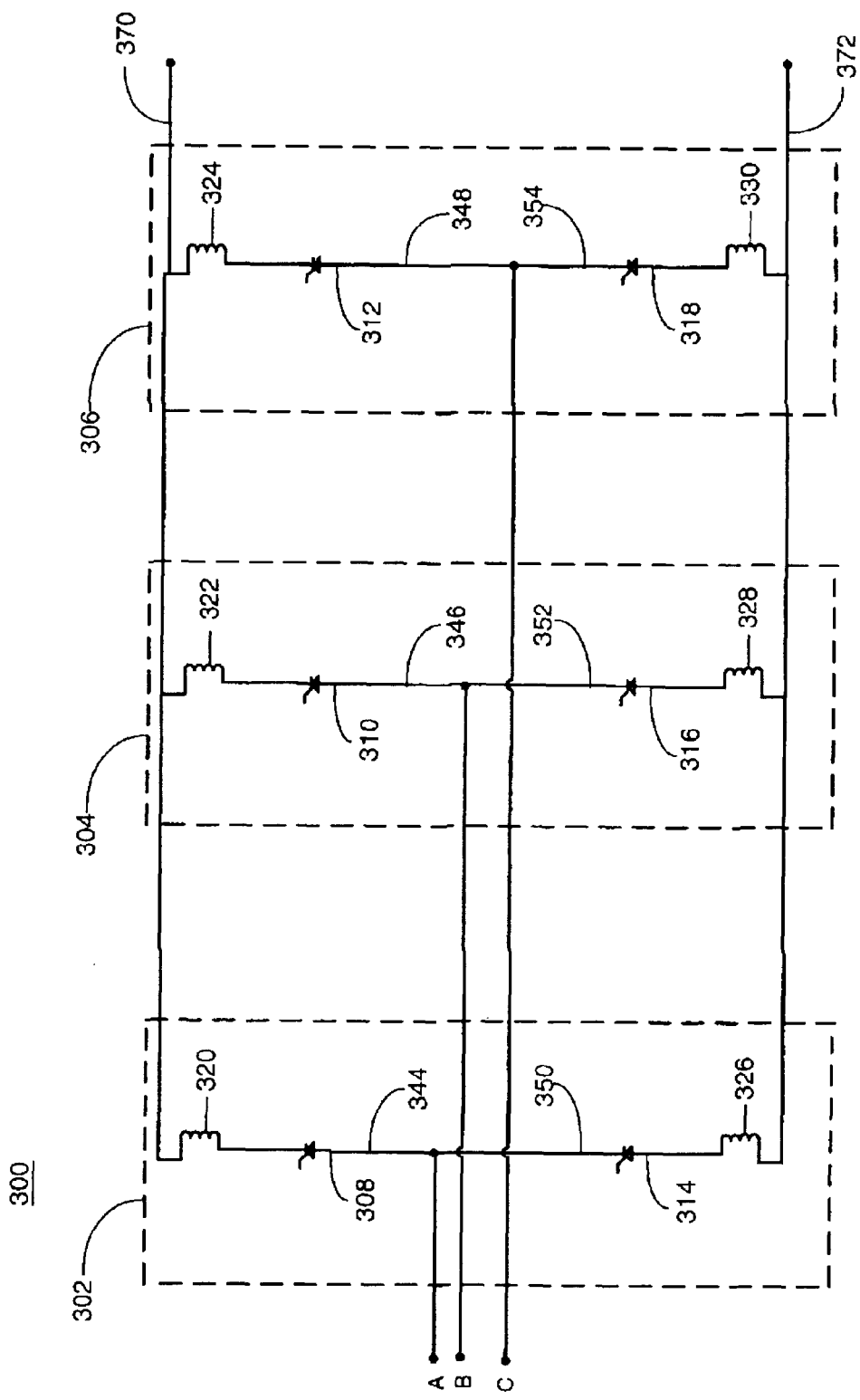
FIG. 3 is an embodiment of a source thyristor bridge rectifier.

An example 300 of the source thyristor bridge rectifiers 210 and 212 is show in more detail in FIG. 3. Each may comprise multiple diametric cells 302, 304, and 306. Each input A, B, and C of the source thyristor bridge rectifier 300 may be electrically coupled to the center of a respective diametric cell 302, 304, and 306. The source thyristor bridge rectifier may comprise thyristors 308, 310, 312, 314, 316, and 318; and leg reactors 320, 322, 324, 326, 328, and 330. The A phase diametric cell 302 will be described in more detail, but it is apparent from the diagram that this discussion may relate to the other diametric cells in the source thyristor bridge rectifier 300. The top thyristor 308 in the A phase diametric cell 302, along with the leg reactor 320 associated with it may comprise the positive leg 344 of the diametric cell 302. In the same respect, the bottom thyristor 314 in the A phase diametric cell 302, along with the leg reactor 326 associated with it may comprise the negative leg 350 of the diametric cell 302. The leg reactor 320 of the positive leg 344 of the A phase diametric cell 302 may be electrically connected to the cathode of the thyristor 308 as shown in FIG. 3, or it may be electrically connected to the anode of the thyristor 308. The same is true of the leg reactor 326 and the thyristor 314 of the negative leg 350 of the A phase diametric cell 302. If the system requirements dictate, the positive leg 344 of the A phase diametric cell 302 may comprise a plurality of reactors connected in series between the cathode of the thyristor 308 and the positive DC bus 370, or in series between the anode of the thyristor 308 and the A phase input, or in both locations. Multiple thyristors may also be connected in series within the positive leg 344. The same holds true for the negative leg 350. Positive legs 346 and 348, and negative legs 352 and 354 are similar. Although there may be different discrete components, it is generally accepted in the field that the positive leg of a diametric cell of a source thyristor bridge rectifier comprises the series components between the input A of the source thyristor bridge 300 and the positive DC bus output 370. In the same respect, it is generally accepted in the field that the negative leg of a diametric cell of a source thyristor bridge rectifier comprises the series components between the input A of the source thyristor bridge and the negative DC bus output 372. The diametric cell 302 herein described may be reasonably adapted by one of skill in the art to be used in the load thyristor bridge inverter 216 of the power conversion unit 222.

The physical mounting of a diametric cell is a complicated process. It may be beneficial to constrain all elements of the diametric cells into a stack configuration. An embodiment of the invention is shown in the mechanical layout of the SCR stack diametric cell 408 shown in FIG. 4. In this diagram, there are three bus bars 402, 404, and 406; one may comprise the positive direct current bus 402, 370, one may comprise the negative direct current bus 406, 372, and one may comprise the A phase input 404, A. The bus bars 402, 404 and 406 may be made of a conductive material such as copper, and of a sufficient diameter to adequately carry the specified electric current of the power conversion system 222.

Figure 4:
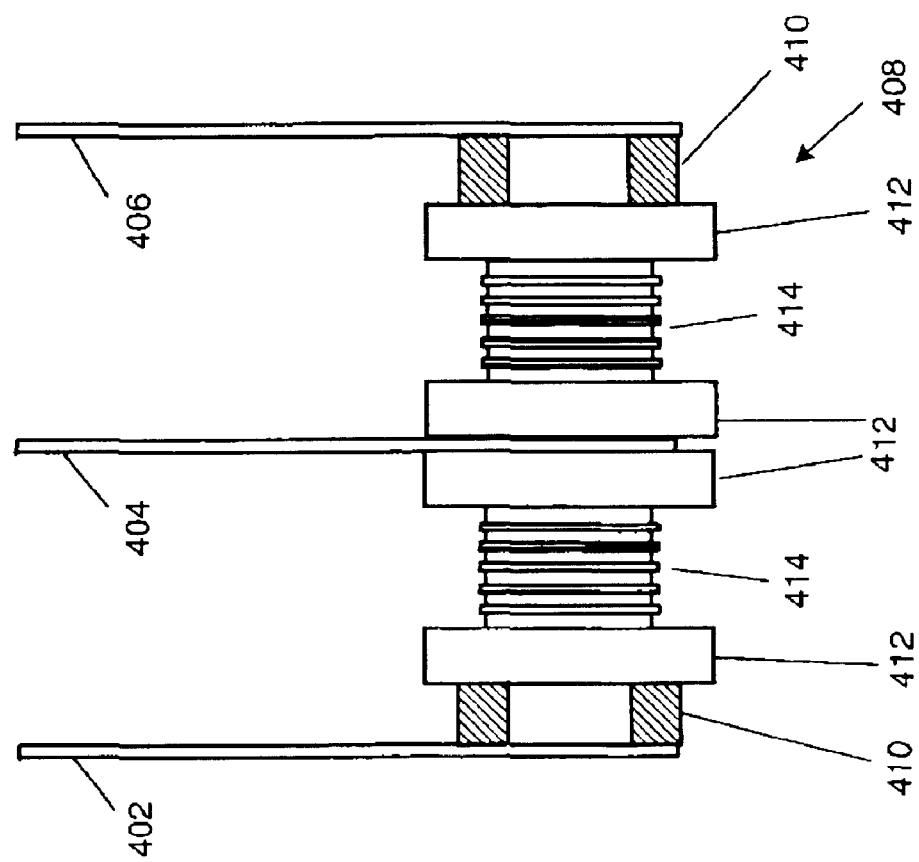
FIG. 4 is an embodiment of the invention in an SCR stack diametric cell.

The bus bars 402, 404, and 406 supply or drain current through the electrically conductive bars (not shown) with reactors 410 mounted around them. The electrically conductive bars (not shown) may also be made of copper or another electrically conductive material. They may be cylindrically shaped conductive pucks that are chosen with adequate electrical characteristics to handle the current and voltage specifications of the SCR stack diametric cell 408. They may be placed between the bus bars 402, 406 and heat sinks 412, as is shown in FIG. 4, or they may be placed between bus bar 404 and heat sinks 412. If the system requirements dictate, the electrically conductive bars (not shown) with reactors 410 mounted around them may be situated in both of the aforementioned places. They may be held in place by the mechanical force of the clamping mechanism (not shown).

The reactors 410 may be made of ferrite, or another magnetically permeably material, and shaped like torroids, or another physical configuration, and are mechanically attached within the SCR stack 408. They may be mounted around the electrically conductive bars (not shown). The combination of the electrically conductive bars (not shown) and reactors 410 effectively may be a single turn inductor around a conductive path. The inductive attributes of the reactors 410 may, among other things, be used to protect the SCRs 414 from the damaging electrical considerations discussed earlier. The selection of the magnetically permeable material, its size, and its shape may be optimized through a set of mathematical calculations. The optimization process may take into account the total core loss, calculated inductance, and the saturation current of the material and its configuration. Although ferrite toroids are chosen as an example here, it is understood that any material with magnetic permeability characteristics sufficient to inhibit the electrical inputs to the SCRs 414 may be used.

The electrically conductive bars (not shown) that hold the toroids 410 may be abutted to heat sinks 412. Because the SCRs 414 dissipate a great amount of heat during operation, the heat sinks 412 are used in an attempt to expel the heat from the SCR stack 408 into the ambient air. The heat sinks 412 may be made of copper, or a combination of copper and aluminum for lower cost. Although this is a suggested material, they may be made from any material that provides high thermal conductivity. The heat sinks may be liquid or air cooled. They may also be shaped to maximize their surface area, provide numerous heat-emitting edges, optimize conductive currents created by the flow of heated air, and provide other beneficial features that improve heat transfer from the heat sink to the air, thereby cooling the SCRs 414. The heat sinks may not be required in some systems because the bus bars themselves may be utilized as the heat sink depending upon their thermal design.

The entire SCR stack diametric cell 408 is clamped together by a clamp mechanism (not shown). This mechanism may apply sufficient pressure to the aforementioned elements to allow for an electrical current to pass between the bus bars 402, 404, and 406 when the proper voltage characteristics and triggering associated with each SCR 414 occurs. Each element of the SCR stack diametric cell 408 may not be welded to an adjacent element, but rather the mechanical force of the clamping mechanism (not shown) may apply sufficient pressure for an electrical current to pass from one element to the next.

FIG. 5 shows another embodiment of the invention in which multiple SCRs 514, and electrically conductive bars (not shown) with reactors 510 mounted around them are used in each leg of the diametric cell. This may be done to further decrease the destructive electrical perturbations experienced by each SCR as the system operates, among other considerations. The SCR stack diametric cell 508 contains reactors 510 within the stack separated form the SCRs 514 by heat sinks 512. The electrically conductive bars (not shown) abut the bus bars 502, 504, and 506. Each element of the SCR stack diametric cell 508 may not be welded to an adjacent element, but rather the mechanical force of the clamping mechanism (not shown) may apply sufficient pressure for an electrical current to pass from one element to the next.

Although the SCR stack diametric cell 408 discussed herein is attributed to the source thyristor bridge rectifiers 210 and 212 of the power conversion device 222, one skilled in the art would be able to apply this system to the diametric cells of the load thyristor bridge rectifier 216. The description also entails only one SCR per leg of the diametric cell, but it is understood that series connections of SCRs are commonly used in each leg. The series connections of SCRs may be isolated from each other by requisite heat sinks. It is understood that the aforementioned internal reactor SCR stack could be applied by one of ordinary skill in the art to other systems where SCR stacks are employed.

What is claimed is:

1. A thyristor stack system comprising:
   a first bus bar;
   a second bus bar;
   a third bus bar;
   a first leg operatively connected between the first and the second bus bars;
   a second leg operatively connected between the second and third bus bars;
   each of the first and second legs comprising:
      a first electrically conductive bar;
      a second electrically conductive bar;
      a first thyristor operatively connected between the first and second electrically conductive bars;
      a first magnetically permeable structure;
      a second magnetically permeable structure, wherein the first electrically conductive bar is encircled by the first magnetically permeable structure, and the second electrically conductive bar is encircled by the second magnetically permeable structure.

2. The system of claim 1, wherein the first magnetically permeable structures is a ferrite toroid.

3. The system of claim 1, wherein the first thyristor is a silicon controlled rectifier.

4. The system of claim 1, further comprising a first and a second heat sink;
   the first heat sink operatively connected between the first thyristor and the first electrically conductive bar, and
   the second heat sink operatively connected between the first thyristor and the second electrically conductive bar.

5. The system of claim 1, further comprising a plurality of thyristors operatively connected between the first and the second electrically conductive bars.

6. The system of claim 5 further comprising a plurality of heat sinks operatively connected between the first and the second electrically conductive bars.

7. An load commutated inverter static starter system comprising:

a first alternating current power source;

a power conversion device with a source thyristor bridge rectifier having a thyristor stack system, the thyristor stack system comprising:
- a first bus bar;
- a second bus bar;
- a third bus bar;
- a first leg operatively connected between the first and the second bus bars;
- a second leg operatively connected between the second and third bus bars;
- each of the first and second legs comprising:
  - a first electrically conductive bar;
  - a second electrically conductive bar;
  - a first thyristor operatively connected between the first and second electrically conductive bars;
  - a first magnetically permeable structure;
  - a second magnetically permeable structure, wherein the first electrically conductive bar is encircled by the first magnetically permeable structure, and the second electrically conductive bar is encircled by the second magnetically permeable structure.

8. The system of claim 7, wherein the first magnetically permeable structure is a ferrite toroid.

9. The system of claim 7, whereby said first thyristor is a silicon controlled rectifier.

10. The system of claim 7, further comprising a first and a second heat sink; the first heat sink operatively connected between the first thyristor and the first electrically conductive bar, and the second heat sink operatively connected between the first thyristor and the second electrically conductive bar.

11. The system of claim 7, further comprising a plurality of thyristors operatively connected between the first and the second electrically conductive bars.

12. The system of claim 11, further comprising a plurality of heat sinks operatively connected between the first and the second electrically conductive bars.

13. A method for constructing a thyristor stack comprising:

constructing a first leg by
- operatively connecting a first thyristor between a first and a second electrically conductive bar;
- operatively encircling the first electrically conductive bar with a first magnetically permeable structure; and
- operatively encircling the second electrically conductive bar with a second magnetically permeable structure;

constructing a second leg by
- operatively connecting a second thyristor between a third and a fourth electrically conductive bar;
- operatively encircling the third electrically conductive bar with a third magnetically permeable structure; and
- operatively encircling the fourth electrically conductive bar with a fourth magnetically permeable structure;
- operatively connecting the first leg between a first bus bar and a second bus bar; and
- operatively connecting a second leg between the second bus bar and a third bus bar.

14. The method of claim 13, wherein the first magnetically permeable is a ferrite toroid.

15. The method of claim 13, wherein the first thyristor is a silicon controlled rectifier.

16. The method of claim 13, further comprising:

operatively connecting a first heat sink between the first thyristor and the first electrically conductive bar; and operatively connecting a second heat sink between the first thyristor and the second electrically conductive bar.

17. The method of claim 13, further comprising:

operatively connecting a plurality of thyristors between the first and the second electrically conductive bars.

18. The method of claim 17, further comprising:

operatively connecting a plurality of heat sinks between the first and the second electrically conductive bars.

* * * * *

UNITED STATES PATENT AND TRADEMARK OFFICE
CERTIFICATE OF CORRECTION

| | | |
|---|---|---|
| PATENT NO. | : 6,713,898 B2 | Page 1 of 1 |
| APPLICATION NO. | : 09/683252 | |
| DATED | : March 30, 2004 | |
| INVENTOR(S) | : Robert Gregory Wagoner et al. | |

It is certified that error appears in the above-identified patent and that said Letters Patent is hereby corrected as shown below:

Col. 8, line 23: insert --structure-- immediately after "permeable."

Signed and Sealed this

Seventh Day of November, 2006

JON W. DUDAS
*Director of the United States Patent and Trademark Office*